United States Patent
Iguchi

(10) Patent No.: US 9,779,968 B2
(45) Date of Patent: Oct. 3, 2017

(54) METHOD FOR PROCESSING SEMICONDUCTOR SUBSTRATE AND METHOD FOR MANUFACTURING SEMICONDUCTOR DEVICE IN WHICH SAID PROCESSING METHOD IS USED

(71) Applicant: Fuji Electric Co., Ltd., Kanagawa (JP)

(72) Inventor: Kenichi Iguchi, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/063,976

(22) Filed: Mar. 8, 2016

(65) Prior Publication Data

US 2016/0189982 A1 Jun. 30, 2016

Related U.S. Application Data

(63) Continuation of application No. PCT/JP2015/061188, filed on Apr. 10, 2015.

(30) Foreign Application Priority Data

Apr. 10, 2014 (JP) ................................. 2014-081035

(51) Int. Cl.
  *H01L 21/48* (2006.01)
  *H01L 21/28* (2006.01)
  (Continued)

(52) U.S. Cl.
  CPC ...... *H01L 21/4871* (2013.01); *H01L 21/0245* (2013.01); *H01L 21/02505* (2013.01);
  (Continued)

(58) Field of Classification Search
  None
  See application file for complete search history.

(56) References Cited

U.S. PATENT DOCUMENTS 6,372,608 B1  4/2002 Shimoda et al.
RE38,466 E  3/2004 Shimoda et al.
(Continued)

FOREIGN PATENT DOCUMENTS

JP  2002-343972 A  11/2002
JP  2004-140381 A  5/2004
(Continued)

OTHER PUBLICATIONS

English translation of Written Opinion (PCT/ISA/237) issued in PCT/JP2015/061188 mailed in Jun. 2015.
(Continued)

*Primary Examiner* — Jay C Chang
(74) *Attorney, Agent, or Firm* — Chen Yoshimura LLP

(57) ABSTRACT

Provided are a method of processing a semiconductor substrate and a method of manufacturing a semiconductor device that uses this method of processing. The method of processing the semiconductor substrate includes: a bonding step in which a supporting plate, which is composed primarily of a material that substantially transmits laser light of prescribed wavelength, and a principal surface of a semiconductor substrate, which is composed primarily of a material that substantially transmits the laser light of the prescribed wavelength, are arranged to face each other in a vacuum and then pressed together in the vacuum with an intermediate layer that includes an amorphous silicon layer interposed therebetween; and a separating step in which, after the laser light is radiated from a side of the supporting plate and the intermediate layer absorbs laser energy, the semiconductor substrate and the supporting plate are separated from each other.

21 Claims, 14 Drawing Sheets

(51) Int. Cl.
*H01L 21/02* (2006.01)
*H01L 21/324* (2006.01)
*H01L 21/683* (2006.01)
*H01L 29/16* (2006.01)
*H01L 29/20* (2006.01)
*H01L 23/00* (2006.01)

(52) U.S. Cl.
CPC ............ *H01L 21/28* (2013.01); *H01L 21/324* (2013.01); *H01L 21/6835* (2013.01); *H01L 29/1608* (2013.01); *H01L 29/2003* (2013.01); *H01L 23/562* (2013.01); *H01L 2221/6834* (2013.01); *H01L 2221/68327* (2013.01); *H01L 2221/68381* (2013.01)

(56) References Cited

U.S. PATENT DOCUMENTS

| | | | |
|---|---|---|---|
| 2002/0053676 A1* | 5/2002 | Kozaki | B82Y 20/00 257/88 |
| 2004/0219762 A1 | 11/2004 | Shimoda et al. | |
| 2004/0241934 A1 | 12/2004 | Inoue | |
| 2005/0173725 A1* | 8/2005 | Kunisato | H01L 33/0079 257/103 |
| 2007/0066039 A1 | 3/2007 | Agarwal et al. | |
| 2008/0164572 A1* | 7/2008 | Toyoda | H01L 21/324 257/616 |
| 2009/0001504 A1* | 1/2009 | Takei | H01L 21/26506 257/507 |
| 2009/0233418 A1 | 9/2009 | Agarwal et al. | |
| 2011/0241157 A1* | 10/2011 | Mazure | H01L 21/187 257/506 |
| 2012/0258554 A1* | 10/2012 | Belle | H01L 21/76251 438/4 |
| 2014/0225229 A1* | 8/2014 | Hachigo | H01L 21/76251 257/615 |
| 2016/0204023 A1* | 7/2016 | Imaoka | H01L 21/2007 438/455 |

FOREIGN PATENT DOCUMENTS

| | | |
|---|---|---|
| JP | 2004-319538 A | 11/2004 |
| JP | 2008-207221 A | 9/2008 |
| JP | 2009-509339 A | 3/2009 |
| JP | 2010-232625 A | 10/2010 |
| JP | 2014-11301 A | 1/2014 |
| JP | 2014-56863 A | 3/2014 |
| JP | 2015-15401 A | 1/2015 |
| WO | 2007/035333 A1 | 3/2007 |

OTHER PUBLICATIONS

International Search Report (ISR) issued in PCT/JP2015/061188 mailed in Jun. 2015.

Written Opinion (PCT/ISA/237) issued in PCT/JP2015/061188 mailed in Jun. 2015. (Concise Explanation of Relevance: This Written Opinion considers that the claims are described by or obvious over the references Nos. 2-7 cited in ISR above.).

* cited by examiner

METHOD FOR PROCESSING SEMICONDUCTOR SUBSTRATE AND METHOD FOR MANUFACTURING SEMICONDUCTOR DEVICE IN WHICH SAID PROCESSING METHOD IS USED

BACKGROUND OF THE INVENTION

Technical Field

The present invention relates to a method of processing a semiconductor substrate that includes bonding a supporting plate to a semiconductor substrate and separating the bonded supporting plate from the semiconductor substrate, as well as to a method of manufacturing a semiconductor device in which the processing method is used.

Background Art

Vertical power devices include a plurality of layers formed by diffusing or implanting impurities into a semiconductor substrate. Of these layers, the drift layer (the layer along which carriers drift due to the electric field) tends to exhibit a higher electrical resistance than the other layers. Forming this drift layer too thickly results in a significant increase in the on-voltage and the forward voltage drop of the device, which tends to cause an undesirable increase in the normal operation loss of the device. Therefore, there is demand to reduce the thickness of the drift layer to the minimum thickness at which the required breakdown voltage can still be achieved.

The simplest method of reducing the thickness of the drift layer is to use a thinner semiconductor substrate. To achieve a voltage rating of 600V, an Si substrate with a thickness on the order of 100 µm or an SiC substrate with a thickness on the order of 10 µm may be used, for example. Furthermore, configurations that include a field-stop layer inhibit expansion of the depletion layer, thereby making it possible to further reduce the thickness of the semiconductor substrate.

However, semiconductor substrates with a thickness of less than or equal to 100 µm are more prone to warping due to applied stress and are also more prone to cracking and chipping due to their low mechanical strength, thereby increasing the difficulty associated with handling such substrates. In particular, while SiC substrates are harder than Si substrates, SiC substrates have low elasticity and become increasingly prone to cracking as the thickness decreases. This can potentially result in significant decreases in manufacturing efficiency and yield rates for devices produced using such SiC substrates.

One possible solution to this problem is a manufacturing method that starts with using a relatively thick semiconductor substrate in order to reduce the potential for cracking or chipping and then reducing the thickness of the semiconductor substrate before the end of the manufacturing method to produce a thin, finished semiconductor substrate.

More specifically, as illustrated in FIG. 5A, the process starts with a thick semiconductor substrate 101, and the required semiconductor functional regions 103 are formed on the front surface 102 of the semiconductor substrate 101. Next, as illustrated in FIG. 5B, the semiconductor substrate 101 is reinforced by bonding a supporting plate 105 to the front surface 102 of the semiconductor substrate 101 using an adhesive layer 104, and a chemical mechanical polishing (CMP) process or the like is applied to reduce the thickness of the semiconductor substrate 101 to the proper design thickness. Then, as illustrated in FIG. 5C, the required rear surface functional layer 107 is formed on the rear surface 106 of the reduced-thickness semiconductor substrate. Finally, as illustrated in FIG. 5D, the supporting plate 105 is removed, thereby leaving the thin semiconductor substrate 101 remaining. During this process, the semiconductor substrate 101 is reinforced by the supporting plate 105, which provides high mechanical and physical strength and makes it easier to handle the semiconductor substrate.

Patent Document 1, for example, discloses a method of manufacturing an SiC device in which an SiC substrate and a supporting plate are bonded together using a wax, adhesive tape, an adhesive, or the like, and during a heat treatment performed after the bonding process, a local annealing method such as laser annealing is used so that no thermal load is applied to the adhesive.

Meanwhile, Patent Document 2 discloses a method of manufacturing a bonded substrate that includes: forming, on a surface of at least one of a group III-nitride semiconductor substrate and a first supporting plate, a first buffer film having a surface with a surface roughness $R_{rms}$ of 0.1 to 10,000 nm; and bonding the group III-nitride semiconductor substrate to the first supporting plate.

RELATED ART DOCUMENTS

Patent Documents

Patent Document 1: Japanese Patent Application Laid-Open Publication No. 2009-509339 (paragraphs [0036] to [0044])

Patent Document 2: Japanese Patent Application Laid-Open Publication No. 2010-232625 (abstract; paragraph [0009])

SUMMARY OF THE INVENTION

However, if an adhesive with low heat resistance such as a wax or a polymer-based adhesive is used to bond together the semiconductor substrate and the supporting plate and the assembly is heated to a temperature greater than the heat resistance temperature of the adhesive during the manufacturing method, voids may form in the bonded region and cause the substrates to separate, the adhesive may melt and contaminate the surrounding areas, or the chemical properties of the adhesive may change and make it impossible to separate the Si semiconductor substrate and the supporting plate apart from one another. This type of method suffers from being limited to temperatures less than or equal to the heat resistance temperature of the adhesive (100° C. to 400° C.) during all processes that occur after the semiconductor substrate bonding process.

When using an SiC substrate, it is typically necessary to perform a high-temperature heat treatment at a temperature near 1000° C. in order to reduce contact resistance. However, SiC substrates are excellent thermal conductors, therefore making it difficult to perform the necessary heat treatments while keeping the temperature of the adhesive portions of the SiC substrate less than or equal to the heat resistance temperature of the polymer-based adhesive used.

Moreover, when manufacturing reverse-blocking IGBT devices, the applied layer of the polymer-based adhesive may be exposed to acids, alkalis, gases, plasmas, or the like via through-portions formed during through-etching on the rear surface of the Si substrate. This exposure may cause issues or defects in the adhesive.

The present invention was made in view of the above-mentioned problems and aims to provide a method of processing a semiconductor substrate that includes bonding a supporting plate to a semiconductor substrate and separating the bonded supporting plate from the semiconductor substrate, as well as a method of manufacturing a semiconductor device in which the processing method is used. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a method of processing a semiconductor substrate, including: a bonding step in which a supporting plate, which is composed primarily of a material that substantially transmits laser light of prescribed wavelength, and a principal surface of a semiconductor substrate, which is composed primarily of a material that substantially transmits the laser light of the prescribed wavelength, are arranged to face each other in a vacuum and then pressed together in the vacuum with an intermediate layer that includes an amorphous silicon layer interposed therebetween; and a separating step in which, after the laser light is radiated from a side of the supporting plate and the intermediate layer absorbs laser energy, the semiconductor substrate and the supporting plate are separated from each other.

In one aspect of the present invention, the semiconductor substrate and the supporting plate are pressed together with the intermediate layer sandwiched therebetween, thereby bonding the semiconductor substrate and the supporting plate together with the intermediate layer functioning as a bonding layer. Bonding the supporting plate to the semiconductor substrate increases the mechanical strength of the semiconductor substrate, thereby making it possible to prevent cracking of the semiconductor substrate. This makes it easier to handle the semiconductor substrate. Moreover, after forming the device, the bonded assembly is irradiated with laser light from the supporting plate side. This causes a large number of cracks to form in the bonding layer, thereby fracturing the bonding layer and making it possible to separate the no longer necessary supporting plate from the semiconductor substrate. This, in turn, makes it possible to obtain the desired semiconductor substrate by itself, thereby making it possible to use the surface to which the supporting plate was bonded for another purpose.

In the method of processing the semiconductor substrate according to the present invention, it is preferable that the semiconductor substrate and the supporting plate be silicon carbide or gallium nitride semiconductor substrates.

According to the abovementioned aspect, silicon carbide and gallium nitride semiconductor substrates substantially transmit the laser light of a prescribed wavelength, thereby making these materials suitable for use in the present invention.

In the method of processing the semiconductor substrate according to the present invention, it is preferable that the bonding step be performed in a vacuum of less than or equal to $10^{-5}$ Pa.

According to the abovementioned aspect, this makes it possible to prevent surface oxidization of the bonding surfaces, which typically hinders the bonding process.

It is preferable that the method of processing the semiconductor substrate according to the present invention further include, before the bonding step, irradiating a bonding surface of the semiconductor substrate and/or the supporting plate with an ion beam or an atomic beam.

Moreover, in the method of processing the semiconductor substrate according to the present invention, it is preferable that an element used in the beam include at least one of helium, neon, argon, krypton, and xenon.

According to the abovementioned aspect, this makes it possible to clean the bonding surfaces and activate the surface atoms thereon, thereby making it possible to improve adhesion.

In the method of processing the semiconductor substrate according to the present invention, it is preferable that the prescribed wavelength of the laser light be in a range from 390 nm to 1000 nm.

According to the abovementioned aspect, this makes it possible for the laser light to pass through the silicon carbide supporting plate and also makes it possible to make the bonding layer absorb energy from the laser light.

In the method of processing the semiconductor substrate according to the present invention, it is preferable that a pressing force used to bond together the semiconductor substrate and the supporting plate be greater than or equal to 9.8 kPa.

According to the abovementioned aspect, this makes it possible to prevent unexpected separation of the semiconductor substrate and the supporting plate during a method of manufacturing a semiconductor device.

In the method of processing the semiconductor substrate according to the present invention, it is preferable that the intermediate layer include the amorphous silicon layer on each bonding surface of the semiconductor substrate and the supporting plate.

Alternatively, in the method of processing the semiconductor substrate according to the present invention, it is preferable that the intermediate layer include the amorphous silicon layer on a bonding surface of the semiconductor substrate or the supporting plate; and a multilayer film made of an amorphous silicon layer, a metal layer, and an amorphous silicon layer stacked in that order on a bonding surface of the other of the semiconductor substrate or the supporting plate.

Alternatively, in the method of processing the semiconductor substrate according to the present invention, it is preferable that the intermediate layer include a multilayer film made of the amorphous silicon layer, a metal layer, and an amorphous silicon stacked in that order on each bonding surface of the semiconductor substrate and the supporting plate.

Alternatively, in the method of processing the semiconductor substrate according to the present invention, it is preferable that the intermediate layer include a multilayer film made of the amorphous silicon layer and a metal layer stacked in that order on each bonding surface of the semiconductor substrate and the supporting plate.

According to the abovementioned aspect, this makes it possible to bond the semiconductor substrate and the supporting plate together using an intermediate layer material with high heat resistance, thereby making it possible to perform any high-temperature processes necessary to form a device after the bonding process.

In the method of processing the semiconductor substrate according to the present invention, it is preferable that a thickness of the metal layer in the intermediate layer be 2 nm to 200 nm.

According to the abovementioned aspect, this makes it possible to make the metal layers absorb energy from the laser light, thereby preventing potential damage to the semiconductor functional regions under the metal layers.

In the method of processing the semiconductor substrate according to the present invention, it is preferable that a total thickness of all of the amorphous silicon layers in the intermediate layer be greater than a thickness of the metal layer.

According to the abovementioned aspect, this makes it possible to reliably fracture the bonding layer by irradiation with laser light and to be able to separate apart the semiconductor substrate and the supporting plate even if the amorphous Si layers react with the metal layers to form silicide layers, because at least a portion of the amorphous Si layers does not undergo silicidation.

In the method of processing the semiconductor substrate according to the present invention, it is preferable that, while radiating the laser light from the side of the supporting plate and the intermediate layer is absorbing the laser energy, a focal depth of the laser light be adjusted such that primary energy absorption locations for the laser light in the intermediate layer are positioned closer to the supporting plate than the metal layer.

According to the abovementioned aspect, this makes it possible to efficiently fracture the amorphous Si layer positioned further on the supporting plate side than is the metal layer.

In another aspect, the present disclosure provides a method of manufacturing a semiconductor device, including: a first device forming step in which a first device having a semiconductor functional region is formed in a principal surface of a semiconductor substrate, which is composed primarily of a material that substantially transmits laser light of a prescribed wavelength; a bonding step in which a supporting plate, which is composed primarily of a material that substantially transmits the laser light of the prescribed wavelength, and the principal surface of the semiconductor substrate where the semiconductor functional region is formed are arranged in a vacuum to face each other and then pressed together in the vacuum with an intermediate layer that includes an amorphous silicon layer interposed therebetween; a thickness reducing step in which a thickness of the semiconductor substrate bonded with the supporting plate is reduced by grinding down another principal surface of the semiconductor substrate; a second device forming step in which a second device having a semiconductor functional region is formed in the another principal surface of the semiconductor substrate, the thickness of which has been reduced by grinding; and a separating step in which, after the laser light is radiated from a side of the supporting plate and the intermediate layer absorbs laser energy, the semiconductor substrate and the supporting plate are separated from each other.

According to the abovementioned aspect, this makes it possible to prevent cracking of the semiconductor substrate during the various manufacturing steps. This also makes it easier to handle the semiconductor substrate. Furthermore, this makes it possible to perform high-temperature processes for forming a device or the like without any problems after the bonding step.

In the method of manufacturing the semiconductor device according to the present invention, it is preferable that the semiconductor substrate and the supporting plate be silicon carbide semiconductor substrates of polytype 3C, 4H, or 6H.

According to the abovementioned aspect, silicon carbide semiconductor substrates of polytype 4H and 6H exhibit few crystallographic defects and have excellent electrical properties, thereby making these materials suitable for use in manufacture of semiconductor devices.

In the method of manufacturing a semiconductor device according to the present invention, it is preferable that the second device forming step include a heat treatment performed at a temperature greater than or equal to 600° C.

According to the abovementioned aspect, this relaxes any temperature-related restrictions on processes included in the second device formation process.

In the method of manufacturing the semiconductor device according to the present invention, it is preferable that the intermediate layer include the amorphous silicon layer on each bonding surface of the semiconductor substrate and the supporting plate, and the bonding step include bonding the semiconductor substrate to the supporting plate via the amorphous silicon layers.

Alternatively, in the method of manufacturing the semiconductor device according to the present invention, it is preferable that the intermediate layer include a multilayer film made of the amorphous silicon layer, a metal layer, and an amorphous silicon stacked in that order on each bonding surface of the semiconductor substrate and the supporting plate, and the bonding step include bonding the semiconductor substrate to the supporting plate via the amorphous silicon layers.

Alternatively, in the method of manufacturing the semiconductor device according to the present invention, it is preferable that the intermediate layer include: the amorphous silicon layer on a bonding surface of the semiconductor substrate or the supporting plate; and a multilayer film formed of an amorphous silicon layer, a metal layer, and an amorphous silicon layer stacked in that order on a bonding surface of the other of the semiconductor substrate or the supporting plate, and the bonding step include bonding the semiconductor substrate to the supporting plate via the amorphous silicon layers.

Alternatively, in the method of manufacturing the semiconductor device according to the present invention, it is preferable that the intermediate layer include a multilayer film made of the amorphous silicon layer and a metal layer stacked in that order on each bonding surface of the semiconductor substrate and the supporting plate, and the bonding step include bonding the semiconductor substrate to the supporting plate via the metal layers.

According to the abovementioned aspect, this makes it possible to bond the semiconductor substrate and the supporting plate together using an intermediate layer material with high heat resistance, thereby making it possible to perform any high-temperature processes necessary to form a device after the bonding process.

It is preferable that the method of manufacturing the semiconductor device according to the present invention further include, after the first device forming step, planarizing the principal surface of the semiconductor substrate in which the semiconductor functional region is formed.

According to the abovementioned aspect, this planarizes the bonding surface of the semiconductor substrate, thereby improving adhesion when the bonding layer is formed.

In at least one aspect of the present invention, the semiconductor substrate and the supporting plate are pressed together with the intermediate layer sandwiched therebetween, thereby bonding the semiconductor substrate and the supporting plate together, with the intermediate layer functioning as a bonding layer. Bonding the supporting plate to the semiconductor substrate increases the mechanical strength of the semiconductor substrate, thereby making it possible to prevent cracking of the semiconductor substrate.

This also makes it easier to handle the semiconductor substrate. Moreover, after forming the device, the bonded assembly is irradiated with laser light from the supporting plate side. This causes a large number of cracks to form in the bonding layer, thereby fracturing the bonding layer and making it possible to separate the no longer necessary supporting plate from the semiconductor substrate. This, in turn, makes it possible to obtain the desired semiconductor substrate by itself, thereby making it possible to use the surface to which the supporting plate was bonded for another purpose.

It is to be understood that both the foregoing general description and the following detailed description are exemplary and explanatory, and are intended to provide further explanation of the invention as claimed.

DETAILED DESCRIPTION OF EMBODIMENTS

Figure 1A:
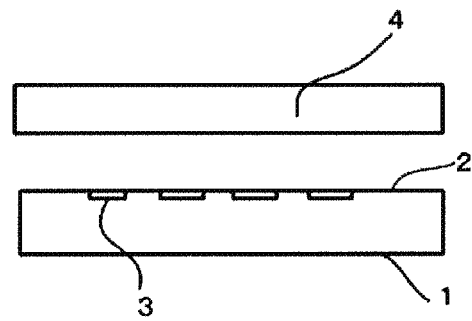
FIGS. 1A to 1I are a series of cross-sectional views schematically illustrating a method of manufacturing a semiconductor device according to Embodiment 1 of the present invention.

In the following description of the embodiments and the attached drawings, the same reference characters are used to indicate components that are the same, and duplicate descriptions of such components will be omitted. Moreover, the attached drawings referenced in the following description are intentionally not drawn to exact scale nor with exact dimensional proportions. This is to facilitate viewing and understanding of the drawings. Furthermore, within the spirit of the present invention, the present invention is not limited to the embodiments as described below.

Embodiment 1

Next, a method of processing a semiconductor substrate according to Embodiment 1 that includes bonding together an SiC substrate and a supporting plate and separating apart the SiC substrate and the supporting plate, as well as a method of manufacturing a MOSFET according to Embodiment 1 in which the processing method is used will be described in detail with reference to FIGS. 1A to 1I.

An n-type 4H-SiC crystal (it is preferable that a 4H or 6H polytype be used for manufacturing a device) with a diameter of 3 inches, a thickness of 350 µm, and an impurity concentration of $1 \times 10^{18}$ cm$^{-3}$ is used for an SiC substrate 1. The front surface of the SiC substrate 1 is planarized to a surface roughness Ra<0.1 nm using a planarization process such as chemical mechanical polishing (CMP). An n-type epitaxial SiC layer (not explicitly illustrated in the figures, but included in the SiC substrate 1) with an impurity concentration of $1 \times 10^{16}$ cm$^{-3}$ and a thickness of 10 µm is deposited on the front surface of the planarized SiC substrate. Next, as illustrated in FIG. 1A, a first device process is performed to form a MOS transistor that includes a gate electrode, a p-type channel region, an n-type source region, a source contact electrode, and the like in the n-type epitaxial SiC layer, thereby forming semiconductor active regions 3. Furthermore, a protective surface film that will not deteriorate at a temperature of 1000° C. such as an amorphous silicon film, a silicon nitride film, a silicon oxide film, or a silicon oxynitride film may be formed as necessary on the front surface of the SiC substrate 1. Note that because the degree of planarization of the uppermost surface of such a protective surface film tends to decrease due to the surface irregularities in the semiconductor active region 3, a planarization process may be applied to this uppermost surface prior to bonding the supporting plate.

Figure 1B:
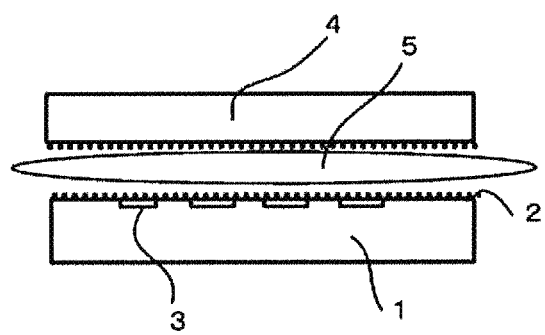

Next, as illustrated in FIG. 1B, the principal surface 2 on the semiconductor active region 3 side of the SiC substrate 1 in which the MOSFET is formed is bonded to an SiC supporting plate 4 using the following process. First, the principal surface 2 on the semiconductor active region 3 side of the SiC substrate 1 in which the MOSFET is formed is arranged facing the principal surface of the SiC supporting plate 4 inside a vacuum furnace (not illustrated in the figure) in which a vacuum of magnitude $10^{-6}$ Pa is drawn. These facing surfaces are irradiated with a 200 W argon (Ar) ion beam 5 and gas-etched to clean the bonding surfaces as well as to activate the surface atomic layers.

During this process, the magnitude of the vacuum is not limited to $10^{-6}$ Pa. The bonding surfaces can still easily be activated as long as a strong vacuum with a magnitude of at least $10^{-5}$ Pa is used. Moreover, the beam used to irradiate the bonding surfaces is not limited to the Ar ion beam 5. Any ion beam or atomic beam may be used. Examples of elements suitable for use in a beam include at least one noble gas selected from among helium, neon, argon, krypton, and xenon. The thickness of the SiC supporting plate 4 is not particularly limited but may be approximately 500 to 1000 µm, for example. In consideration of the coefficients of linear expansion, it is preferable that the material used for the supporting plate 4 be the same as the material used for the SiC substrate 1. However, the material used for the supporting plate 4 is not particularly limited as long as that material has a coefficient of linear expansion close to that of the SiC substrate 1 and transmits laser light of the wavelengths mentioned below. For example, an SiC substrate that has the same polytype as the SiC substrate 1 but is not suitable for use in devices due to excessive crystallographic dislocation and can therefore be obtained at low cost, a low-cost SiC substrate of a different polytype such as 3C, or another material with similar properties may be used. Furthermore, the supporting plate can be reused multiple times.

Figure 1C:
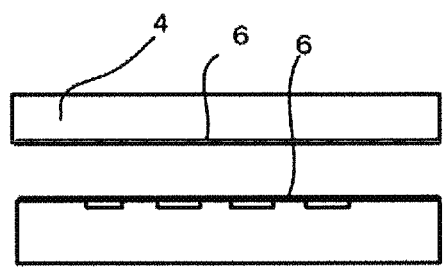
Figure 1D:
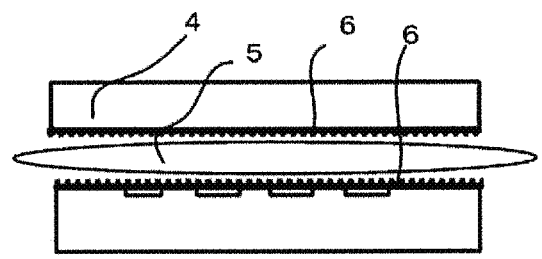
Figure 1E:
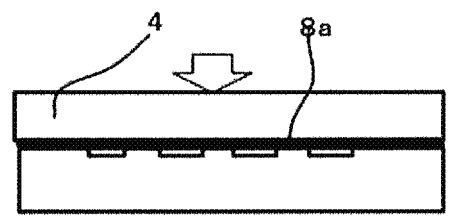

Next, as illustrated in FIG. 1C, amorphous Si layers 6 are formed as films with a thickness of 10 nm on the ion beam-irradiated surfaces of the SiC substrate 1 and the SiC supporting plate 4 arranged in the vacuum furnace. Then, as illustrated in FIG. 1D, the inner surfaces of the assembly are irradiated again with the Ar ion beam 5, and the surfaces of the amorphous Si layers 6 are gas-etched. As illustrated by the arrows in FIG. 1E, after the surfaces of the amorphous Si layers 6 are activated by irradiation with the Ar ion beam 5, both components of the assembly are immediately pressed together in a vacuum in order to form an amorphous Si bonding layer 8a (an intermediate layer 8), thereby bonding together the SiC substrate 1 in which the MOSFET is formed and the SiC supporting plate 4, as illustrated in FIG. 1E. The bond between the SiC substrate 1 in which the MOSFET is formed and the SiC supporting plate 4 does not require that the bonding surfaces be perfectly fused together, and therefore the SiC substrate 1 and the SiC supporting plate 4 may be pressed together at any pressing force greater than or equal to 9.8 kPa under a high vacuum of magnitude $10^{-5}$ to $10^{-7}$ Pa. However, in order to prevent unexpected separation during the overall process and enhance safety, it is preferable that the pressing force be approximately 98 kPa to 980 kPa.

In Embodiment 1, the principal surface 2 on the semiconductor active region 3 side of the SiC substrate 1 in which the MOSFET is formed is arranged facing the principal surface of the SiC supporting plate 4, and these surfaces are simultaneously irradiated with the Ar ion beam 5. However, the process does not necessarily need to be performed in this exact manner, and these principal surfaces may also be activated one at a time. In this case, after activating the surfaces, the two substrates must be bonded together before those surfaces are contaminated. The method of arranging the two substrates facing one another and activating the surfaces simultaneously is therefore advantageous in that doing so makes it possible to bond the substrates together immediately after activation, thereby eliminating the possibility of surface contamination.

Figure 1F:
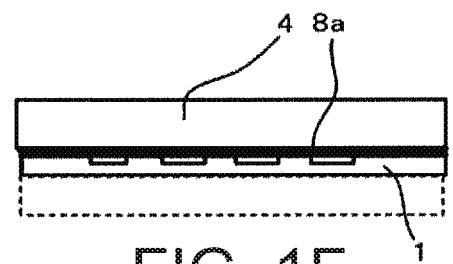

Next, a rear surface process is performed as a second device process on the SiC substrate 1 in which the MOSFET is formed, to which the SiC supporting plate 4 is bonded. As illustrated in FIG. 1F, during this rear surface process the thickness portion indicated by the dashed lines is removed from the rear surface of the SiC substrate 1 in which the MOSFET is formed using a grinding and polishing process or the like. For a device in the 600V breakdown voltage class, for example, the starting SiC substrate with a thickness of 350 μm is thinned to a finished thickness of 10 μm. Furthermore, the ground surface is polished using the abovementioned CMP process in order to remove any remaining grinding damage.

Figure 1G:
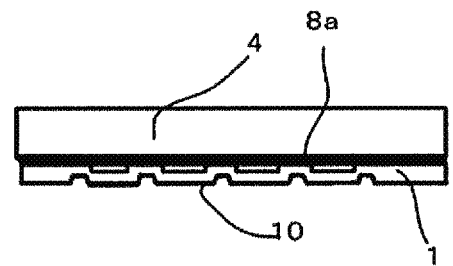

Next, using photolithography, a resist pattern is formed as necessary on the rear surface of the SiC substrate 1 in which the MOSFET is formed, and the rear surface is dry etched to form recess patterns with a depth of 10 μm on top of the scribe lines. FIG. 1G illustrates the assembly once these recess patterns have been formed. Then, an Ni contact electrode layer (not illustrated in the figure) with a thickness of 50 nm is formed in order to improve the contact between the rear surface of the SiC substrate 1 in which the MOSFET is formed and an electrode film 10 that will be formed on this rear surface, and the assembly is high-temperature annealed at approximately 1000° C. to form an Ni silicide layer. A drain electrode film 10 that includes a Ti film and an Ni film is then layered onto this silicide layer. As illustrated in FIG. 1G, the process described above yields the thin SiC substrate 1 in which the MOSFET is formed, which has a thickness of 10 μm and has the front surface thereof reinforced by the SiC supporting plate 4, thereby making it possible to prevent chipping and cracking of the substrate. As described above, in this embodiment of the present invention, the bonding layer (the intermediate layer 8) of the SiC supporting plate 4 is composed primarily of the amorphous Si layers 6, and therefore once the SiC substrate 1 in which the MOSFET is formed and the SiC supporting plate 4 are bonded together, subsequent processes can be performed at high temperatures of greater than or equal to 600° C.

Figure 1H:
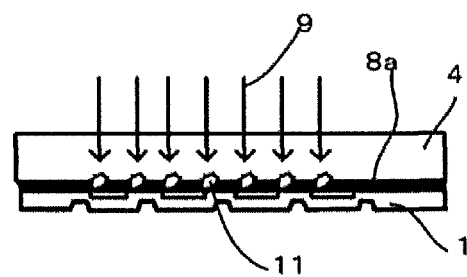

Next, as illustrated in FIG. 1H, the bonded substrate assembly that includes the SiC supporting plate 4 and the SiC substrate 1 in which the MOSFET is formed in which both the front and rear surfaces have been processed is irradiated with laser light 9 from the SiC supporting plate 4 side, with the laser light 9 focused at the depth of the amorphous Si bonding layer 8*a* (the intermediate layer 8). A laser with a wavelength of 532 nm is used for the laser light 9. At this wavelength, the laser light 9 passes through the SiC supporting plate and is absorbed by the amorphous Si bonding layer 8*a* (the intermediate layer 8), thereby generating thermal energy. As a result, the temperature of the amorphous Si bonding layer 8*a* (the intermediate layer 8) increases rapidly, thereby causing the amorphous Si bonding layer 8*a* (the intermediate layer 8) to fracture due to formation of a large number of cracks or the like as the amorphous Si bonding layer 8*a* (the intermediate layer 8) expands and contracts. In FIG. 1H, the reference character 11 indicates the locations where the amorphous Si bonding layer 8*a* (the intermediate layer 8) is fractured due to irradiation with the laser light 9.

Any wavelength may be used for the laser light 9 as long as the laser light 9 passes through the SiC supporting plate 4 and is sufficiently absorbed by the amorphous Si bonding layer 8*a* (the intermediate layer 8). For example, SiC-4H transmits light of wavelengths greater than or equal to approximately 380 nm, SiC-3C transmits wavelengths greater than or equal to approximately 556 nm, and SiC-6H transmits wavelengths greater than or equal to approximately 411 nm. Moreover, Si semiconductors transmit light of wavelengths greater than or equal to approximately 1100 nm. However, wavelengths greater than or equal to 1000 nm are near the edge of the Si absorption spectrum and are not preferable because the absorptivity of the Si film decreases. Therefore, when using the amorphous Si bonding layer 8*a* in combination with the SiC supporting plate 4 of polytype 4H, a wavelength greater than or equal to 380 nm and less than or equal to 1000 nm is selected for the laser light 9. Here, the substrate surfaces are irradiated with laser light of wavelength 532 nm while scanning that light over the substrate surfaces in a grid pattern. Moreover, the shape of the fracture locations in the amorphous Si bonding layer 8*a* (the intermediate layer 8) at which the focal depth of the laser light 9 is aligned may be formed in spot shapes (pulse shapes) by pulsing the laser light 9, in continuous line shapes by using continuous laser light, or in a combination of those shapes.

Figure 1I:
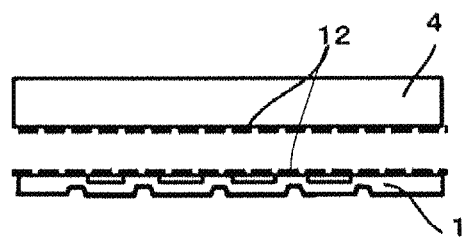

Next, as illustrated in FIG. 1I, a wire or a flat tool (not illustrated in the figure) is inserted between the SiC substrate 1 in which the MOSFET is formed and the SiC supporting plate 4, and peeling stress is applied to the fractured amorphous Si bonding layer 8*a* (the intermediate layer 8) to separate the two substrates. Irradiating the amorphous Si bonding layer 8*a* (the intermediate layer 8) with the laser light 9 fractures the amorphous Si bonding layer 8*a* (the intermediate layer 8) and causes a large number of cracks to form therein, thereby significantly decreasing the bond strength. Therefore, inserting the wire or flat tool (not illustrated in the figure) along the side faces of the substrate assembly as described above makes it possible to quickly break the whole bonding layer and separate the two substrates. Moreover, it is preferable that V-shaped recesses be formed in advance as separation starting points along the outermost peripheral side faces of the bonding surfaces of both substrates by forming tapered portions or the like therealong. This makes it easier to insert the wire or flat tool when separating the two substrates. It is also preferable that the SiC supporting plate 4 be larger than the SiC substrate 1 in which the MOSFET is formed in order to make the bonding interface more apparent.

Next, using a well-known method such as using an adhesive, a second supporting member is fixed to the rear surface of the SiC substrate 1 in which the MOSFET is formed. Then, a well-known etching solution is used to remove any bonding layer residue 12 (that is, any residue left over from the amorphous Si bonding layer 8a from the previous step on the separation surface of the SiC substrate 1 in which the MOSFET is formed) as well as the protective surface film beneath the amorphous Si bonding layer. Next, electrodes and passivation films are formed on the front surface of the SiC substrate 1 in which the MOSFET is formed while the SiC substrate 1 is still fixed to the second supporting member. The method described above makes it possible to produce an SiC substrate 1 in which the MOSFET is formed having a thickness of 10 μm and having a recess pattern on the rear surface thereof.

Embodiment 2

Next, a method of processing a semiconductor substrate according to Embodiment 2 that includes bonding together an SiC substrate and a supporting plate and separating apart the SiC substrate and the supporting plate, as well as a method of manufacturing a MOSFET according to Embodiment 2 in which the processing method is used will be described with reference to FIGS. 2A to 2I.

Figure 2A:
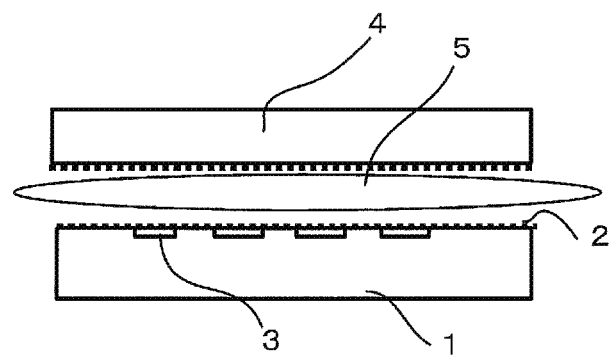
FIGS. 2A to 2I are a series of cross-sectional views schematically illustrating a method of manufacturing a semiconductor device according to Embodiment 2 of the present invention.

In Embodiment 2, the first device process for forming the MOSFET in the SiC substrate 1 is the same as in Embodiment 1 (here, FIG. 2A corresponds to the step illustrated in FIG. 1B). Next, the facing surfaces 2 of the SiC substrate 1 in which the MOSFET is formed and the SiC supporting plate 4 are irradiated with the ion beam 5 in a vacuum and gas-etched to activate those surfaces. As in Embodiment 1, a 200 W Ar ion beam is used.

Figure 2B:
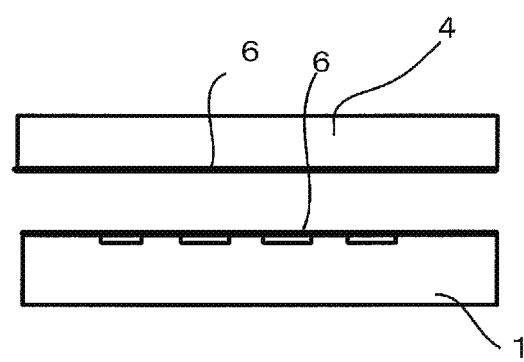
Figure 2C:
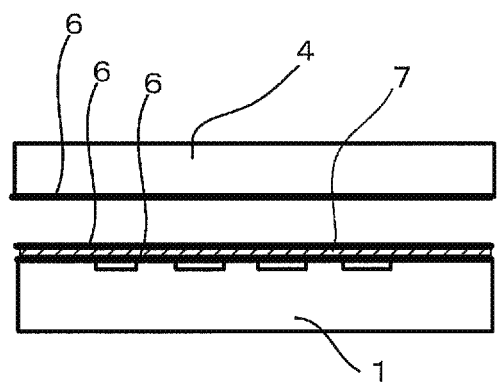
Figure 2D:
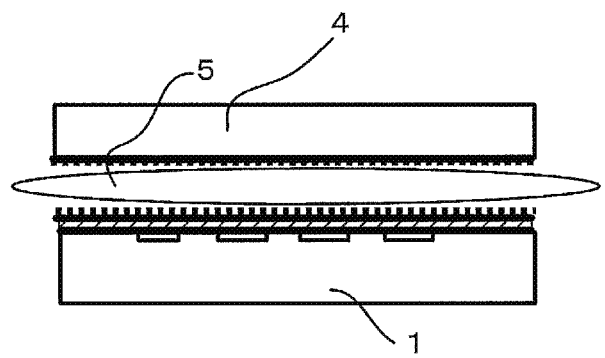
Figure 2E:
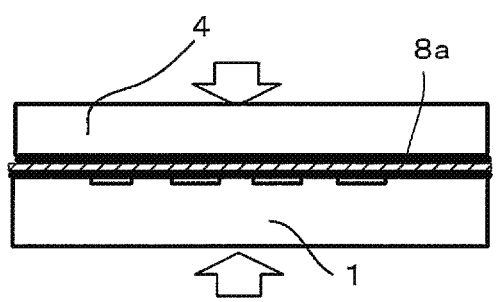
Figure 2F:
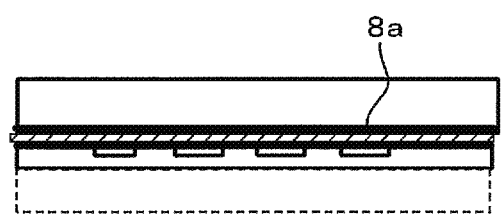
Figure 2G:
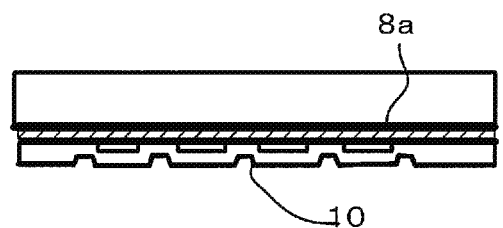
Figure 2H:
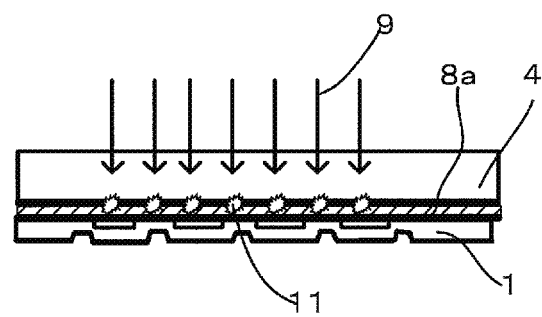
Figure 2I:
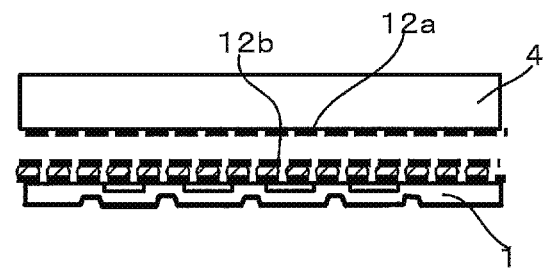

Next, as illustrated in FIG. 2B, amorphous Si layers 6 (with a thickness of 20 nm) are formed as films on the ion beam 5-irradiated surfaces of the SiC supporting plate 4 and the SiC substrate 1 in which the MOSFET is formed. Furthermore, as illustrated in FIG. 2C, a metal layer 7 (with a thickness of 20 nm) made from Ni or the like is formed as a film on top of the amorphous Si layer 6 formed on the SiC substrate 1 in which the MOSFET is formed, and another amorphous Si layer 6 (with a thickness of 20 nm) is formed as a film on top of the metal layer 7, for example. It is preferable that the thickness of the Ni metal layer 7 be selected from a range of 2 to 200 nm and more preferable that the thickness be selected from a range of 5 to 100 nm. Then, as illustrated in FIG. 2D, the facing surfaces of the amorphous Si layers 6 are gas-etched again using the Ar ion beam 5. As illustrated by the arrows in FIG. 2E, after the surfaces of the amorphous Si layers 6 are activated by irradiation with the Ar ion beam 5, the SiC supporting plate 4 and the SiC substrate 1 in which the MOSFET is formed are immediately pressed together in a vacuum in order to form an amorphous Si bonding layer 8a with the Ni metal layer 7 sandwiched therewithin. When the assembly is irradiated with the laser light 9 in order to fracture the amorphous Si bonding layer 8a as described below, this Ni metal layer 7 exhibits excellent absorption of the laser light 9, thereby making it possible to prevent that laser light 9 from reaching the surface of the SiC substrate 1 in which the MOSFET is formed and damaging or causing deterioration of the semiconductor functional regions 3. In order to absorb a sufficient amount of energy from the laser light 9, the thickness of the Ni metal layer 7 must be greater than or equal to 2 nm. However, it is preferable that the thickness of the Ni metal layer 7 not exceed 200 nm because thicknesses greater than 200 nm make it more difficult to fracture the amorphous Si layers 6 by irradiation with the laser light 9. Therefore, as described above, it is preferable that the thickness of the Ni metal layer 7 be in the range of 2 to 200 nm and more preferable that the thickness be in the range of 5 to 100 nm.

Next, as illustrated in FIGS. 2F to 2I, the rear surface process (the second device process) is performed on the rear surface of the SiC substrate 1 in which the MOSFET is formed, as in Embodiment 1. However, the rear surface process in Embodiment 2 differs from Embodiment 1 in that because the Ni metal layer 7 is contained within the amorphous Si bonding layer 8a, the Ni metal layer 7 may react with the amorphous Si layers 6 and form silicide layers (not illustrated in the figure) depending on the annealing parameters used. Formation of such silicide layers may cause the bonding layer 8a to fracture irregularly when irradiated with the laser light 9 due to the non-uniformity of the compositional ratio of the silicide layers in the thickness direction, for example. Therefore, it is preferable that on the laser light 9 irradiation surface side, the amorphous Si layers 6 in the bonding layer 8a remain less silicided relative to their overall thickness than does the Ni metal layer 7. Accordingly, it is preferable that the amorphous Si layers 6 be thicker than the Ni metal layer 7. In Embodiment 2, on the supporting member side there are two amorphous Si layers 6 of thickness 20 nm for a total thickness of 40 nm, and on the SiC substrate 1 in which the MOSFET is formed side there is one amorphous Si layer of thickness 20 nm on top of the Ni metal layer 7. Therefore, the upper amorphous Si layer 6 has a total thickness of 60 nm, which is greater than the 20 nm thickness of the Ni metal layer 7. In this configuration, the amorphous Si layer 6 on the laser light 9 irradiation surface side is thicker than the Ni metal layer 7, thereby increasing the amount of thermal energy generated due to the laser light 9 that gets absorbed by the amorphous Si layer 6. The Ni metal layer 7 also absorbs some of the energy from the laser light 9, thereby decreasing the amount of laser light 9 that proceeds past the Ni metal layer 7 and reaches the surface of the SiC substrate 1 in which the MOSFET is formed. This is preferable due to the resulting elimination of negative effects on the semiconductor functional regions 3 formed in the surface of the SiC substrate 1 in which the MOSFET is formed.

Any residue left over from the Ni metal layer 7 can be lifted off and removed at the same time by removing any amorphous Si residue 12b. In Embodiment 2 as described above, the Ni metal layer 7 was formed on the facing substrate surfaces on the side of the SiC substrate 1 in which the MOSFET is formed. However, the Ni metal layer 7 may alternatively be formed on the facing substrate surfaces on the side of the SiC supporting plate 4.

Embodiment 3

Next, a method of processing a semiconductor substrate according to Embodiment 3 that includes bonding together an SiC substrate and a supporting plate and separating apart the SiC substrate and the supporting plate, as well as a method of manufacturing a MOSFET according to Embodiment 3 in which the processing method is used will be described with reference to FIGS. 3A to 3I.

Figure 3A:
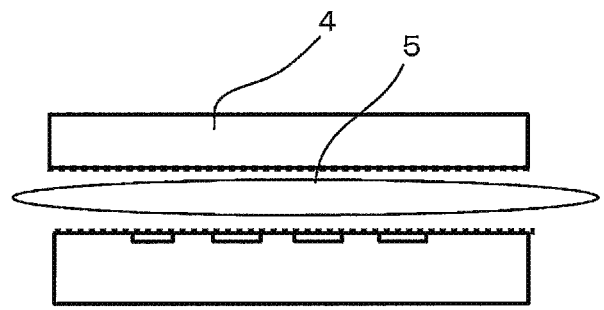
FIGS. 3A to 3I are a series of cross-sectional views schematically illustrating a method of manufacturing a semiconductor device according to Embodiment 3 of the present invention.
Figure 3B:
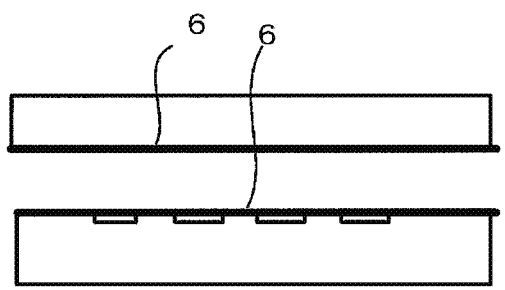
Figure 3C:
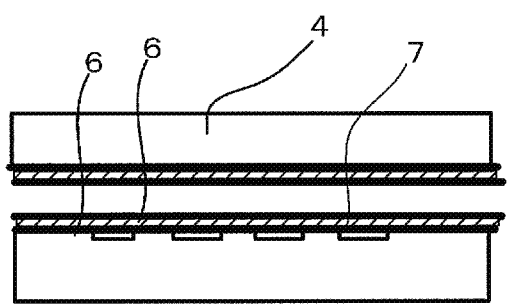
Figure 3D:
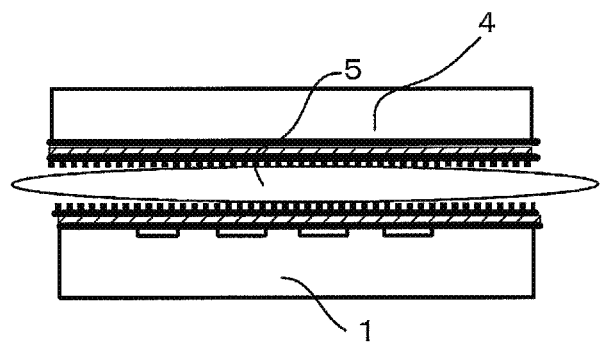
Figure 3E:
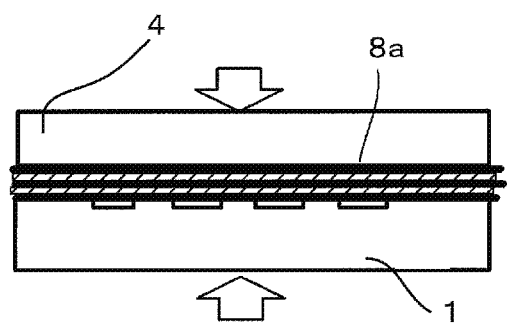
Figure 3F:
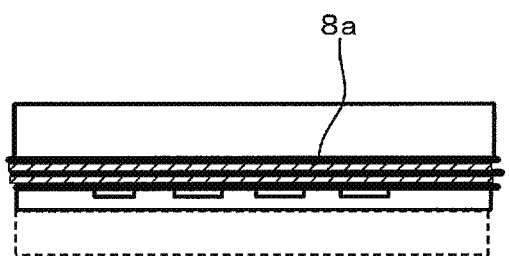
Figure 3G:
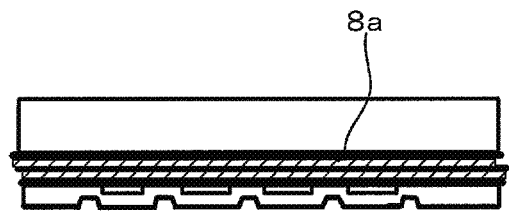
Figure 3H:
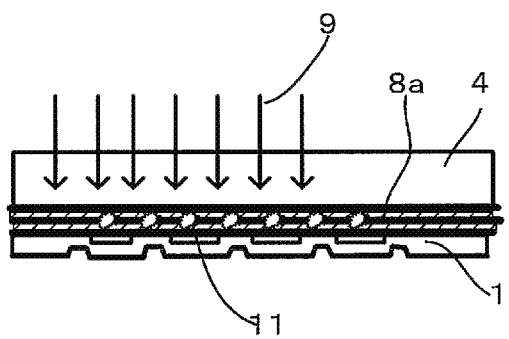

In Embodiment 2 as described above, the bonding layer 8a includes not only the amorphous Si layers 6 but also the metal layer 7 (the Ni metal layer 7). However, in the method of manufacturing a semiconductor device described in Embodiment 2, the Ni metal layer 7 was formed on only one of the facing surfaces of the SiC substrate 1 in which the MOSFET is formed and the supporting plate 4. As illustrated in FIGS. 3A to 3I, in Embodiment 3 the method of manufacturing a semiconductor devices includes forming a triple-layer amorphous Si layer 6/Ni metal layer 7/amorphous Si layer 6 stack on both of the facing surfaces of the SiC substrate 1 in which the MOSFET is formed and the supporting plate 4, as illustrated in FIG. 3C. The process for bonding together the adjacent amorphous Si layers 6 is the same as in Embodiments 1 and 2, and the rest of the processes in Embodiment 3 are the same as in Embodiment 2.

Figure 3I:
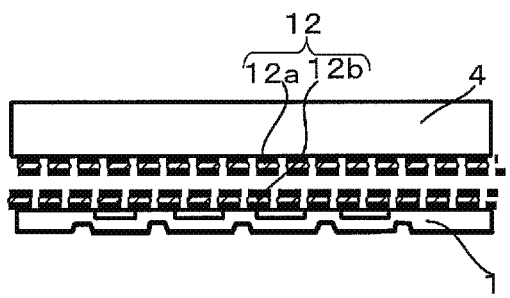
Figure 4A:
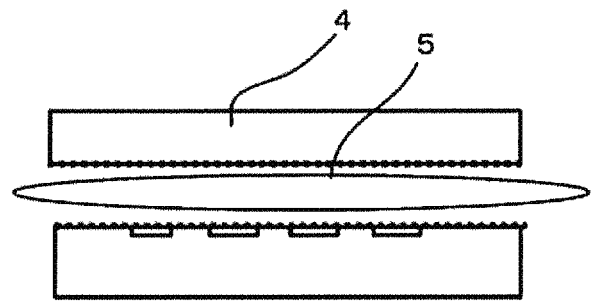
FIGS. 4A to 4I are a series of cross-sectional views schematically illustrating a method of manufacturing a semiconductor device according to Embodiment 5 of the present invention.
Figure 4B:
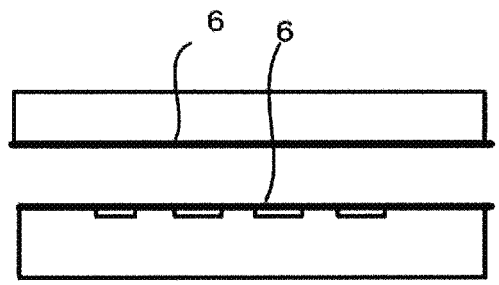
Figure 4C:
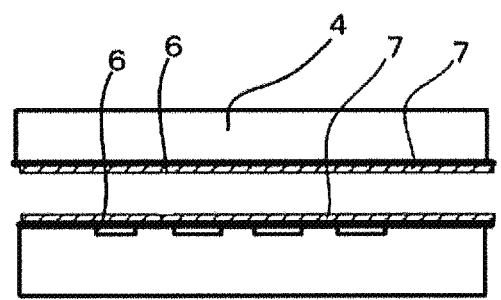
Figure 4D:
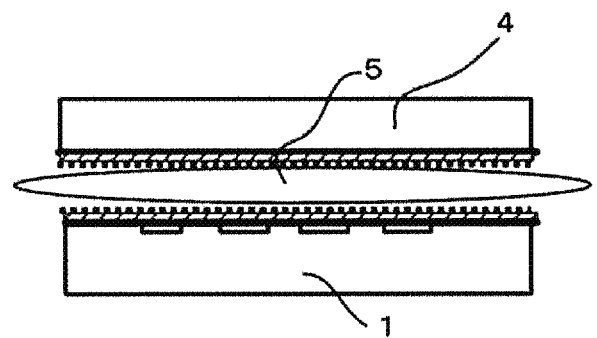
Figure 4E:
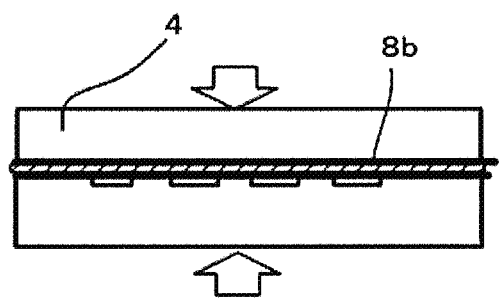
Figure 4F:
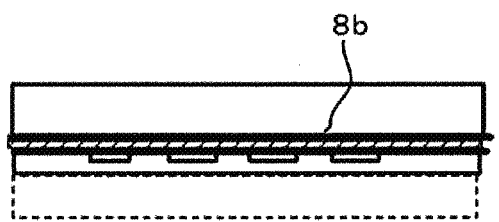
Figure 4G:
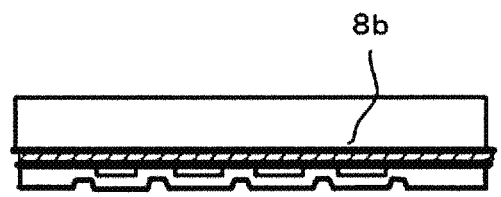
Figure 4H:
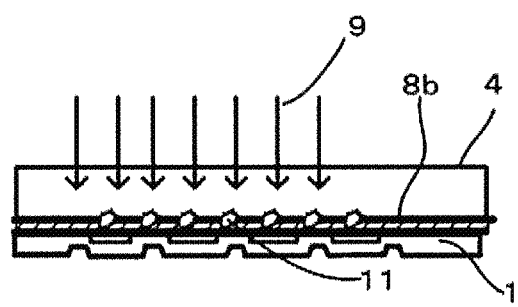
Figure 4I:
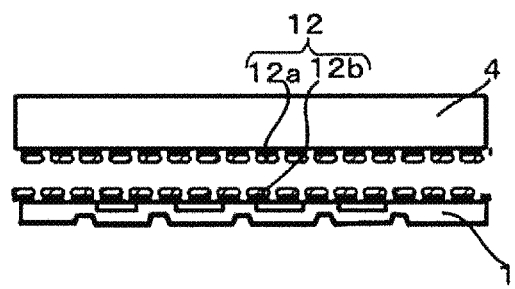
Figure 5A:
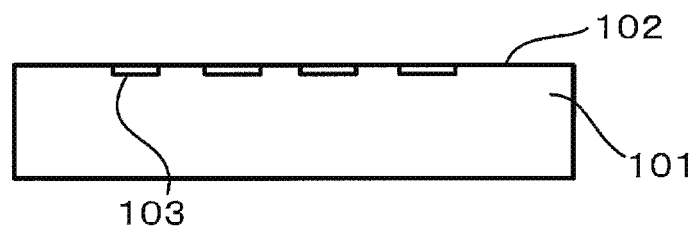
FIGS. 5A to 5D are a series of cross-sectional views schematically illustrating a conventional method of processing a semiconductor substrate.
Figure 5B:
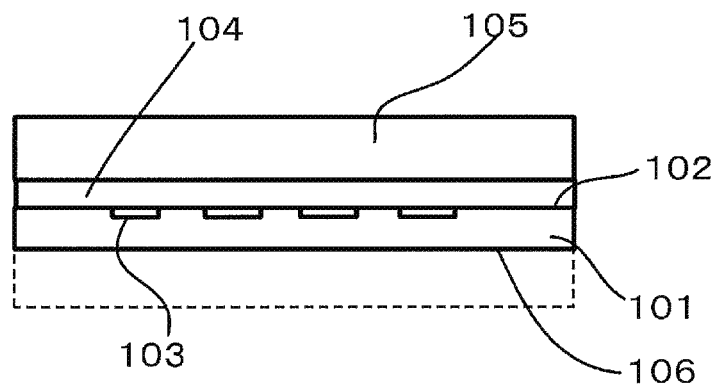
Figure 5C:
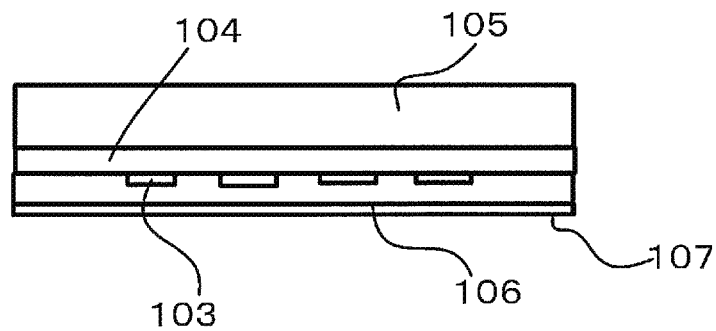
Figure 5D:
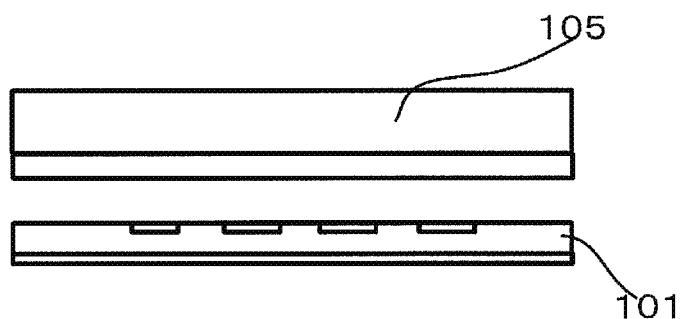

When irradiating the assembly with the laser light 9, the focal depth of the laser light 9 is aligned with the bonded amorphous Si layers 6. Therefore, as illustrated in FIG. 3I, bonding layer residue 12 that includes amorphous Si layer residue 12b and Ni metal layer residue 12a remains on the separated SiC substrates. However, the Ni metal layer residue 12a can be lifted off and easily removed simply by using an Si etching solution to remove the amorphous Si layer residue 12b.

Embodiment 4

Embodiment 4 of the present invention is substantially the same as Embodiment 3. Embodiment 4 is different from Embodiment 3 in that iron (Fe) is used for the metal film 7 and in that amorphous Si layer 6/Fe metal layer 7/amorphous Si layer 6 stacks are formed with respective film thicknesses of 10 nm/3 nm/10 nm.

In this case as well, bonding layer residue 12 remains on the SiC substrates when separated after irradiating the assembly with the focal depth aligned with the bonded amorphous Si layers 6, but this bonding layer residue 12 can be removed easily. Here, various metals other than Ni and Fe may be used for the metal layer 7 as long as the selected metal exhibits good adhesion with Si and maintains its mechanical strength during processes performed at 1000° C.

Embodiment 5

Next, a method of processing a semiconductor substrate according to Embodiment 5 that includes bonding together an SiC substrate and a supporting plate and separating apart the SiC substrate and the supporting plate, as well as a method of manufacturing a MOSFET according to Embodiment 5 in which the processing method is used will be described with reference to FIGS. 4A to 4I.

Embodiment 5 is different from Embodiments 1 to 4 in that in order to form the bonding layer, adjacent Ni metal layers 7 are bonded together rather than bonding together adjacent amorphous Si layers 6. Therefore, amorphous Si layer 6/Ni metal layer 7 stacks are formed on both of the facing surfaces of the SiC substrate 1 in which the MOSFET is formed and the supporting plate 4. As illustrated by the arrows in FIG. 4E, after the surfaces of the Ni metal layers 7 are activated by irradiation with the Ar ion beam 5, the SiC supporting plate 4 and the SiC substrate 1 in which the MOSFET is formed are immediately pressed together in a vacuum in order to form a bonding layer 8b between the adjacent Ni metal layers 7. When irradiated with the laser light 9, the Ni metal layers 7 can be fractured and separated at a lower temperature than the amorphous Si layers 6. Therefore, laser light 9 of a lower energy than the laser light 9 used to separate the amorphous Si layers 6 may be used, thereby making this separation process easier.

As described above, the SiC substrate 1 in which the MOSFET is formed is reinforced by fixing the SiC supporting plate 4 thereto. Therefore, even if the SiC substrate 1 in which the MOSFET is formed is thinned to a thickness of less than or equal to 100 μm, keeping the SiC supporting plate 4 attached allows high-temperature processes (at temperatures up to the 1300° C. melting point of Si) to be performed. Furthermore, after completing the high-temperature processes, the SiC substrate 1 in which the MOSFET is formed and the SiC supporting plate 4 can easily be separated apart by irradiating the assembly with the laser light 9 from the SiC supporting plate 4 side. This is advantageous due to the elimination of restrictions on process temperatures such as those typically present in conventional rear surface processes (such as keeping temperatures less than or equal to 400° C.).

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A method of processing a semiconductor substrate, comprising:
    a bonding step in which a supporting plate, which is composed primarily of a material that substantially transmits laser light of prescribed wavelength, and a principal surface of a semiconductor substrate, which is composed primarily of a material that substantially transmits the laser light of the prescribed wavelength, are arranged to face each other in a vacuum and then pressed together in the vacuum with an intermediate layer that includes an amorphous silicon layer interposed therebetween; and
    a separating step in which, after the laser light is radiated from a side of the supporting plate and the intermediate layer absorbs laser energy, the semiconductor substrate and the supporting plate are separated from each other,
    wherein the method further comprises, before the bonding step:
        irradiating a bonding surface of at least one of the semiconductor substrate and the supporting plate with an ion beam or an atomic beam;
        forming an amorphous silicon layer on said bonding surface of the at least one of the semiconductor substrate and the supporting plate; and
        irradiating a surface of the amorphous silicon layer on said bonding surface of the at least one of the semiconductor substrate and the supporting plate with an ion beam or an atomic beam.

2. The method of processing the semiconductor substrate according to claim 1, wherein the semiconductor substrate and the supporting plate are silicon carbide or gallium nitride semiconductor substrates.

3. The method of processing the semiconductor substrate according to claim 1, wherein the bonding step is performed at a vacuum of less than or equal to $10^{-5}$ Pa.

4. The method of processing the semiconductor substrate according to claim 1, wherein an element used in the beam in each irradiation step includes at least one of helium, neon, argon, krypton, and xenon.

5. The method of processing the semiconductor substrate according to claim 1, wherein the prescribed wavelength of the laser light is in a range from 390 nm to 1000 nm.

6. The method of processing the semiconductor substrate according to claim 1, wherein a pressing force used to bond together the semiconductor substrate and the supporting plate is greater than or equal to 9.8 kPa.

7. The method of processing the semiconductor substrate according to claim 1, wherein the intermediate layer comprises the amorphous silicon layer on the bonding surface of each of the semiconductor substrate and the supporting plate.

8. The method of processing the semiconductor substrate according to claim 1, wherein the intermediate layer comprises: the amorphous silicon layer on a bonding surface of the semiconductor substrate or the supporting plate; and a multilayer film made of an amorphous silicon layer, a metal layer, and an amorphous silicon layer stacked in that order on a bonding surface of the other of the semiconductor substrate or the supporting plate.

9. The method of processing the semiconductor substrate according to claim 8, wherein a thickness of the metal layer in the intermediate layer is 2 nm to 200 nm.

10. The method of processing the semiconductor substrate according to claim 8, wherein a total thickness of all of the amorphous silicon layers in the intermediate layer is greater than a thickness of the metal layer.

11. The method of processing the semiconductor substrate according to claim 8, wherein, while radiating the laser light from the side of the supporting plate and the intermediate layer is absorbing the laser energy, a focal depth of the laser light is adjusted such that primary energy absorption locations for the laser light in the intermediate layer are positioned closer to the supporting plate than the metal layer.

12. The method of processing the semiconductor substrate according to claim 1, wherein the intermediate layer comprises a multilayer film made of the amorphous silicon layer, a metal layer, and an amorphous silicon stacked in that order on each bonding surface of the semiconductor substrate and the supporting plate.

13. The method of processing the semiconductor substrate according to claim 1, wherein the intermediate layer comprises a multilayer film made of the amorphous silicon layer and a metal layer stacked in that order on each bonding surface of the semiconductor substrate and the supporting plate.

14. A method of manufacturing a semiconductor device, comprising:
 a first device forming step in which a first device having a semiconductor functional region is formed in a principal surface of a semiconductor substrate, which is composed primarily of a material that substantially transmits laser light of a prescribed wavelength;
 a bonding step in which a supporting plate, which is composed primarily of a material that substantially transmits the laser light of the prescribed wavelength, and the principal surface of the semiconductor substrate where the semiconductor functional region is formed are arranged in a vacuum to face each other and then pressed together in the vacuum with an intermediate layer that includes an amorphous silicon layer interposed therebetween;
 a thickness reducing step in which a thickness of the semiconductor substrate bonded with the supporting plate is reduced by grinding down another principal surface of the semiconductor substrate;
 a second device forming step in which a second device having a semiconductor functional region is formed in said another principal surface of the semiconductor substrate, the thickness of which has been reduced by grinding; and
 a separating step in which, after the laser light is radiated from a side of the supporting plate and the intermediate layer absorbs laser energy, the semiconductor substrate and the supporting plate are separated from each other,
 wherein the method further comprises, before the bonding step and after the first device forming step:
  irradiating a bonding surface of at least one of the semiconductor substrate and the supporting plate with an ion beam or an atomic beam;
  forming an amorphous silicon layer on said bonding surface of the at least one of the semiconductor substrate and the supporting plate; and
  irradiating a surface of the amorphous silicon layer on said bonding surface of the at least one of the semiconductor substrate and the supporting plate with an ion beam or an atomic beam.

15. The method of manufacturing the semiconductor device according to claim 14, wherein the semiconductor substrate and the supporting plate are silicon carbide semiconductor substrates of polytype 3C, 4H, or 6H.

16. The method of manufacturing the semiconductor device according to claim 14, wherein the second device forming step includes a heat treatment performed at a temperature greater than or equal to 600° C.

17. The method of manufacturing the semiconductor device according to claim 14,
 wherein the intermediate layer comprises the amorphous silicon layer on the bonding surface of each of the semiconductor substrate and the supporting plate, and
 wherein the bonding step includes bonding the semiconductor substrate to the supporting plate via said amorphous silicon layers.

18. The method of manufacturing the semiconductor device according to claim 14,
 wherein the intermediate layer comprises: the amorphous silicon layer on a bonding surface of the semiconductor substrate or the supporting plate; and a multilayer film formed of an amorphous silicon layer, a metal layer, and an amorphous silicon layer stacked in that order on a bonding surface of the other of the semiconductor substrate or the supporting plate, and
 wherein the bonding step includes bonding the semiconductor substrate to the supporting plate via said amorphous silicon layers.

19. The method of manufacturing the semiconductor device according to claim 14,
 wherein the intermediate layer comprises a multilayer film made of the amorphous silicon layer, a metal layer, and an amorphous silicon stacked in that order on each bonding surface of the semiconductor substrate and the supporting plate, and
 wherein the bonding step includes bonding the semiconductor substrate to the supporting plate via said amorphous silicon layers.

20. The method of manufacturing the semiconductor device according to claim 14,
 wherein the intermediate layer comprises a multilayer film made of the amorphous silicon layer and a metal layer stacked in that order on each bonding surface of the semiconductor substrate and the supporting plate, and wherein the bonding step includes bonding the semiconductor substrate to the supporting plate via said metal layers.

21. The method of manufacturing the semiconductor device according to claim 14, further comprising, after the first device forming step, planarizing the principal surface of the semiconductor substrate in which the semiconductor functional region is formed.

* * * * *